(12) United States Patent
Kim et al.

(10) Patent No.: US 7,775,681 B2
(45) Date of Patent: Aug. 17, 2010

(54) LIGHTING DEVICE, BACKLIGHT UNIT, AND PRINTED CIRCUIT BOARD THEREOF

(75) Inventors: Yong Suk Kim, Gyeonggi-do (KR); Hoon Hurh, Gyeonggi-do (KR); Geun Ho Kim, Gyeonggi-do (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 257 days.

(21) Appl. No.: 11/862,084

(22) Filed: Sep. 26, 2007

(65) Prior Publication Data

US 2008/0211987 A1 Sep. 4, 2008

(30) Foreign Application Priority Data

Sep. 26, 2006 (KR) .................... 10-2006-0093573

(51) Int. Cl.
*F21V 21/00* (2006.01)
(52) U.S. Cl. .................. 362/249.02; 362/97.3; 362/631
(58) Field of Classification Search ............ 362/249.02, 362/97.1–97.4, 630, 631, 800, 249.01, 249.03–249.06; 439/56, 61, 62
See application file for complete search history.

(56) References Cited

U.S. PATENT DOCUMENTS

| 6,847,221 B2 * | 1/2005 | Kimoto et al. ............. 324/762 |
| 2005/0265051 A1 | 12/2005 | Yamamoto et al. |
| 2006/0092346 A1 | 5/2006 | Moon et al. |

FOREIGN PATENT DOCUMENTS

| JP | 6-334217 A | 12/1994 |
| JP | 2005-353498 A | 12/2005 |
| KR | 10-2006-0046148 A | 5/2006 |
| KR | 10-2006-0102472 A | 9/2006 |
| KR | 10-2007-0023364 A | 2/2007 |

* cited by examiner

*Primary Examiner*—Bao Q Truong
(74) *Attorney, Agent, or Firm*—Birch, Stewart, Kolasch & Birch, LLP

(57) ABSTRACT

A backlight unit including a circuit board mounted with light emitting diodes and formed with connecting pads electrically connected with the light emitting diodes, a driver installed on one surface of the circuit board and configured to drive the light emitting diodes, a connector coupled to the connecting pads of the circuit board, in which the connector has a connecting direction changed toward the driver, and a connecting line for connecting the connector to the driver.

22 Claims, 9 Drawing Sheets

LIGHTING DEVICE, BACKLIGHT UNIT, AND PRINTED CIRCUIT BOARD THEREOF

CROSS REFERENCE TO RELATED APPLICATION

This application claims the benefit of Korean Patent Application No. 10-2006-0093573, filed on Sep. 26, 2006, which is hereby incorporated by reference as if fully set forth herein.

BACKGROUND OF THE INVENTION

1. Field of the Invention

The present invention relates to a lighting device, a backlight unit, and a printed circuit board thereof, and more particularly, to a lighting device, a backlight unit, and a printed circuit board thereof including light emitting elements that can be driven in a sub-divided manner.

2. Discussion of the Related Art

Light emitting diodes (LEDs) are semiconductor light emitting devices that convert current to light so as to emit light. Since a red LED using GaAsP compound semiconductor was commercially available in 1962, it has been used together with a GaP:N-based green LED as a light source in electronic apparatuses for image display.

Further, the wavelength of light emitted from such an LED depends on the semiconductor material used to fabricate the LED, This is because the wavelength of the emitted light depends on the band gap of the semiconductor material representing an energy difference between valence-band electrons and conduction-band electrons.

In addition, a Gallium nitride (GaN) compound semiconductor is used in high-power electronic devices, because it exhibits a high thermal stability and a wide band gap of 0.8 to 6.2 eV. Further, it is possible to fabricate a semiconductor layer capable of emitting green, blue, or white light using GaN in combination with other elements, for example, indium (In), aluminum (Al), etc.

Further, it is possible to fabricate a semiconductor layer capable of emitting green, blue, or white light by combining GaN with other elements, for example, indium (In), aluminum (Al), etc.

Thus, it is possible to adjust the wavelength of light to be emitted by combining GaN with other appropriate elements. Accordingly, when GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

Because emission of white light is possible, the white light can be used for an illumination purpose. For example, white light can be used for a backlight unit of a liquid crystal display (LCD) device. Further, the LCD device, which is a light reception type flat display, has no ability to emit light by itself. Thus, the LCD device forms an image by using a backlight unit (BLU)

In more detail, a BLU includes a plurality of white LEDs arranged on a substrate such that light emitted from the white LEDs can be uniformly diffused. In more detail, FIG. 1 illustrates front circuit boards of a related art LED backlight unit. As shown in FIG. 1, six circuit boards 10 are mounted to a front surface of the backlight unit. Each circuit board 10 includes a plurality of mounts 11, to which LEDs are mounted, respectively, and connecting pads 12 arranged at one end of the circuit board 10, and electrically connected to the mounts 11.

In addition, shown in FIG. 1, the connectors 12 are arranged at opposite lateral ends of the backlight unit, namely, left and right ends of the backlight unit. Further, FIG. 2 illustrates the back surfaces of the circuit boards 10. As shown in FIG. 2, each circuit board 10 is connected to a drive board 30 via a connector 20 and connecting lines 21 under the condition in which the circuit board 10 is fixed to the backlight unit.

FIG. 3 illustrates a connected state of the connector 20. That is, FIG. 3 corresponds to a back surface of a portion "a" in FIG. 2. As shown in FIG. 3, each connector 20 includes a connector body 22, and first and second pins 23 and 24 provided at the connector body 22. The first pins 23 are connected to respective connecting lines, whereas the second pins 24 are connected to the connector 12 of the associated circuit board 10. Thus, the connector 20 connects the associated circuit board 10 to the drive board 30. Each first pin 23 is integral with an associated one of the second pins 24.

In addition, each connecting line 21 extends along the back surface of the associated circuit board 10, and is connected to the drive board 30. Because the circuit boards 10 are densely arranged, the connection of each connecting line to each connector 20 must be achieved only in a direction parallel to the plane of the associated circuit board 10, as shown in FIG. 3.

That is, in the related art backlight unit structure, the connectors 20 and connecting lines are arranged only at the left and right ends of the overall structure of the circuit boards 10, irrespective of the size of the backlight unit.

Therefore, the related art LED backlight unit cannot have a size freely variable in accordance with the size of the used LCD panel. Further, for a backlight unit having a small size, it is sufficient that the connectors are arranged only at one side of the backlight unit. However, for a backlight unit having a large size, there may be problems because the size of the circuit boards must be increased in proportion to the increased size of the backlight unit.

In addition, for an LED backlight unit, LEDs are mounted on circuit boards so that the circuit boards can be assembled to the backlight unit. Therefore, when each circuit board has an increased size, the number of LEDs mounted on the circuit board must be increased.

Meanwhile, the same type of LEDs have differences in terms of wavelength and brightness due to this characteristics. When such differences are increased, an increased color deviation occurs in the backlight unit. In addition for a large-size LED backlight unit using the above-mentioned related art circuit boards, the possibility that the color deviation occurs is increased, because an increased number of LEDs are used for one circuit board. As a result, the backlight unit with an increased size exhibits an increased defect rate.

In addition, for a large-size LED backlight unit using the above-mentioned circuit board, the possibility that the color deviation occurs is increased, because an increased number of LEDS are used for one circuit board. As a result, the backlight unit is manufactured with an increased defect rate.

Furthermore, the increased size of the circuit boards results in an increased size of equipment required for mounting LEDs and other elements on the circuit boards, where the equipment can be, for example, a surface mounting equipment such as a loader, a screen printer, a chip mounter, and a reflow device. Therefore, the cost of equipment is increased, especially because the prices of most surface mounting equipment are high.

SUMMARY OF THE INVENTION

Accordingly, one object of the present invention is to provide a lighting device, a backlight unit, and a printed circuit board thereof that substantially obviates one or more problems caused by the limitations and disadvantages of the related art.

Another object of the present invention is to provide a lighting device and a backlight unit each including circuit boards subdivided to have a reduced size while being capable of independently driving the circuit boards, and a printed circuit board usable for each circuit board of the lighting device and backlight unit.

To achieve these objects and other advantages and in accordance with the purpose of the invention, as embodied and broadly described herein, the present invention provides in one aspect a backlight unit including a circuit board mounted with light emitting diodes and formed with connecting pads electrically connected with the light emitting diodes, a driver installed on one surface of the circuit board, and configured to drive the light emitting diodes, a connector coupled to the connecting pads of the circuit board, the connector having a connecting direction changed toward the driver, and a connecting line for connecting the connector to the driver.

In another aspect the present invention provides a backlight unit including a circuit board having a first surface on which light emitting diodes are mounted, a second surface on which a driver for driving the light emitting diodes is installed, and connecting pads electrically connected with the light emitting diodes, and a connector coupled to the connecting pads, the connector having a connecting direction changed toward the second surface.

In yet another aspect, the present invention provides a printed circuit board including a connector including a plurality of first pins connected to a circuit of the printed circuit board, and a plurality of second pins extending from the first pins while being bent from the first pins, and a connected line connected to the connector.

In still another aspect, the present invention provides a lighting device including a circuit board having a first surface mounted with light emitting diodes and at least one driver configured to drive the light emitting diodes and connecting pads electrically connected to the light emitting diodes, and a connector coupled to the connecting pads of the circuit board, the connector formed to have a connecting direction toward the first surface of the circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE INVENTION

Reference will now be made in detail to the preferred embodiments of the present invention, examples of which are illustrated in the accompanying drawings.

It will be understood that when an element such as a layer, region or substrate is referred to as being "on" another element, it can be directly on the other element or intervening elements may also be present. Further, it will be understood that, although the terms first, second, etc. may be used herein to describe various elements, components, regions, layers and/or sections, these elements, components, regions, layers and/or sections should not be limited by these terms.

FIRST EMBODIMENT

Figure 4:
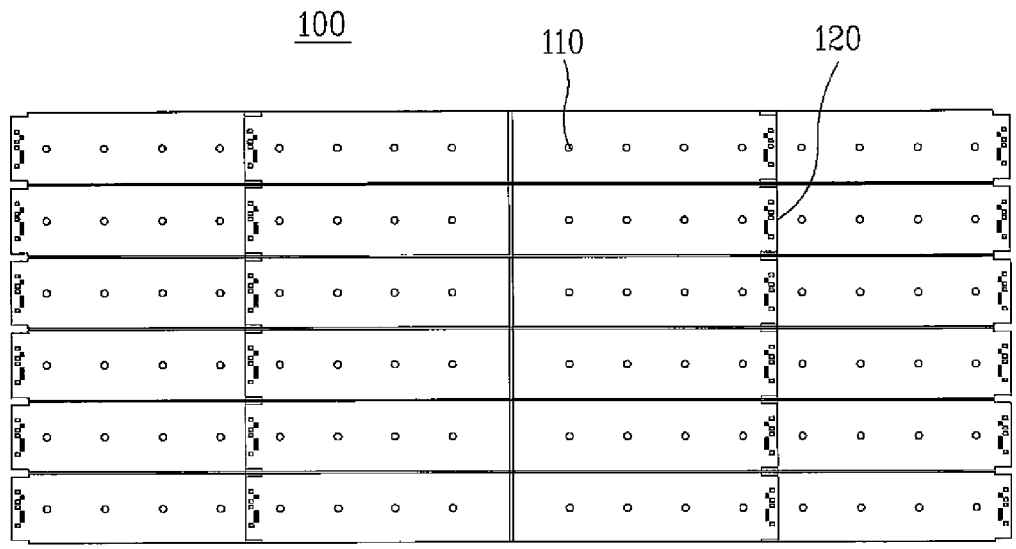
FIG. 4 is a plane view illustrating front surfaces of circuit boards according to and embodiment of the present invention.

Referring to FIG. 4, a backlight unit according to a first embodiment of the present invention is illustrated. The backlight, unit includes a plurality of base plates or circuit boards 100 arranged in horizontal and vertical directions. Light emitting diodes (LEDs) are mounted on a first surface of the backlight unit. The backlight unit also includes drivers 300 (FIG. 11) each supported by a second surface.

The first surface may be a front surface of each circuit board 100, whereas the second surface may be a back surface of each circuit board 100. Alternatively, the second surface may be an inner or outer surface of an element of the backlight unit which is spaced apart from the circuit boards 105 by a certain distance. For each circuit board 100, a printed circuit board may be used. Other types of base plates may also be used.

The following description will be given in conjunction with an example in which the first surface is the front surface of each circuit board 100, and the second surface is the back surface of each circuit board 105.

As shown in FIG. 4a plurality of mounts 110 are formed on the front surface of each circuit board 100, and a light emitting diode (LED) is mounted to each mount 110. The mounts 110 of each circuit board 100 are aligned together horizontally and vertically in this embodiment. Connecting pads 120 are also formed at one lateral end of each circuit board 100, in order to connect the circuit board 100 to a driver.

When a printed circuit board is used for each circuit board 100, the circuit board 100 may include connecting portions (not shown), to which the LEDs of the mounts 110 are coupled, and printed lines connecting the connecting portions to the connecting pads 120.

Figure 5:
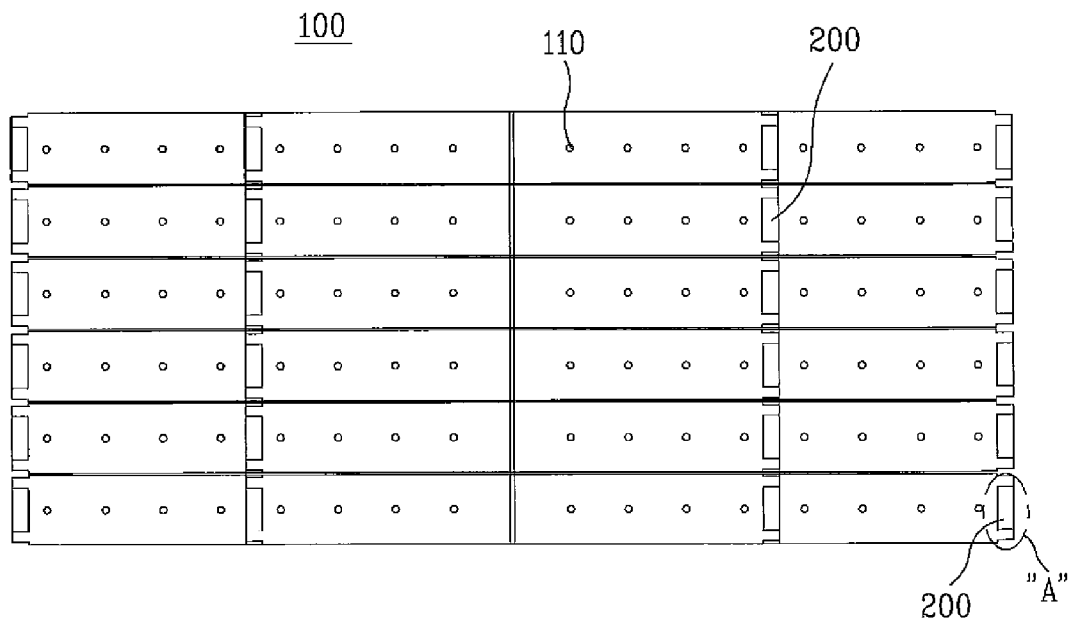
FIG. 5 is a plane view illustrating connectors connected to the circuit boards according to an embodiment of the present invention.

As shown in FIG. 5, a connector 200 is also coupled to the connecting pads 120 of each circuit board 100. The connection direction of the connector 200 may be changed from a horizontal direction to a vertical direction. Accordingly, the connector 200 can be connected to the associated driver 300 (FIG. 11) in a direction other than the direction parallel to the plane of the associated circuit board 100.

That is, the connector 200 has one end extending in a direction parallel to the plane of the circuit board 100 at the front side of the circuit board 100, and the other end extending in a direction perpendicular to the plane of the circuit board 100 such that the other end is connectable to the back side of the circuit board 100. Accordingly, the connector 200 can more easily connect the circuit board 100 to the driver.

Thus, the connectors 200 can be coupled to all circuit boards 100 in a circuit board arrangement including more than two columns of circuit boards 100. That is, the connectors 200 can be coupled not only to the leftmost and rightmost circuit boards 100 in the circuit board arrangement, but also to the inner circuit boards 100 in the circuit board arrangement.

Figure 6:
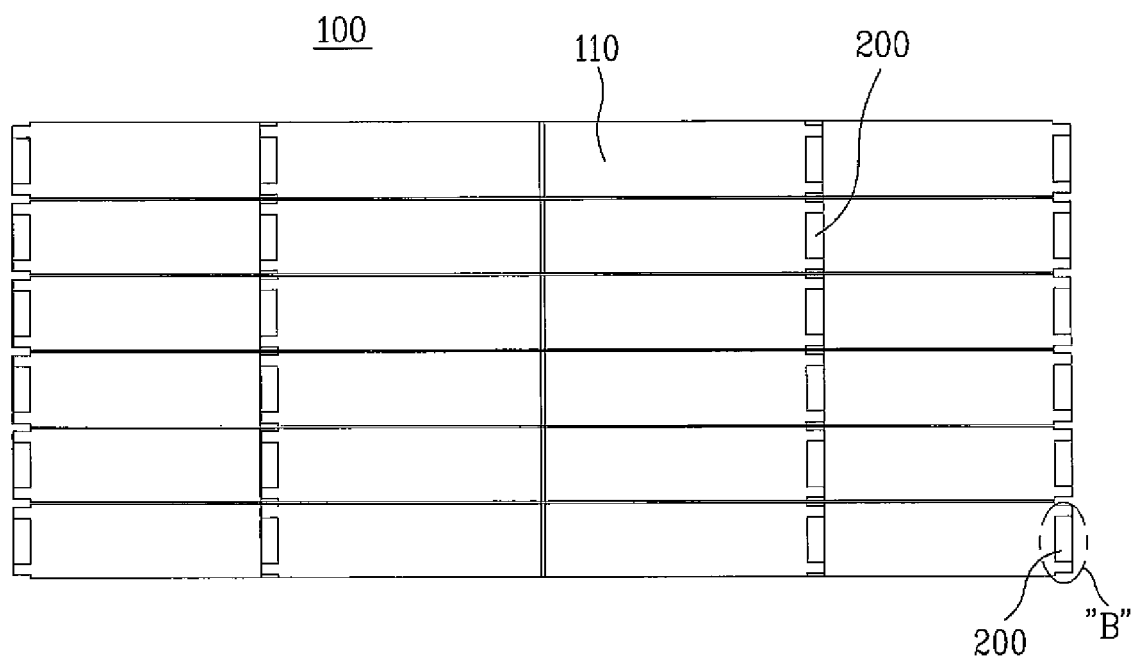
FIG. 6 is a plane view illustrating back surfaces of the circuit board according to and embodiment of the present invention.
Figure 11:
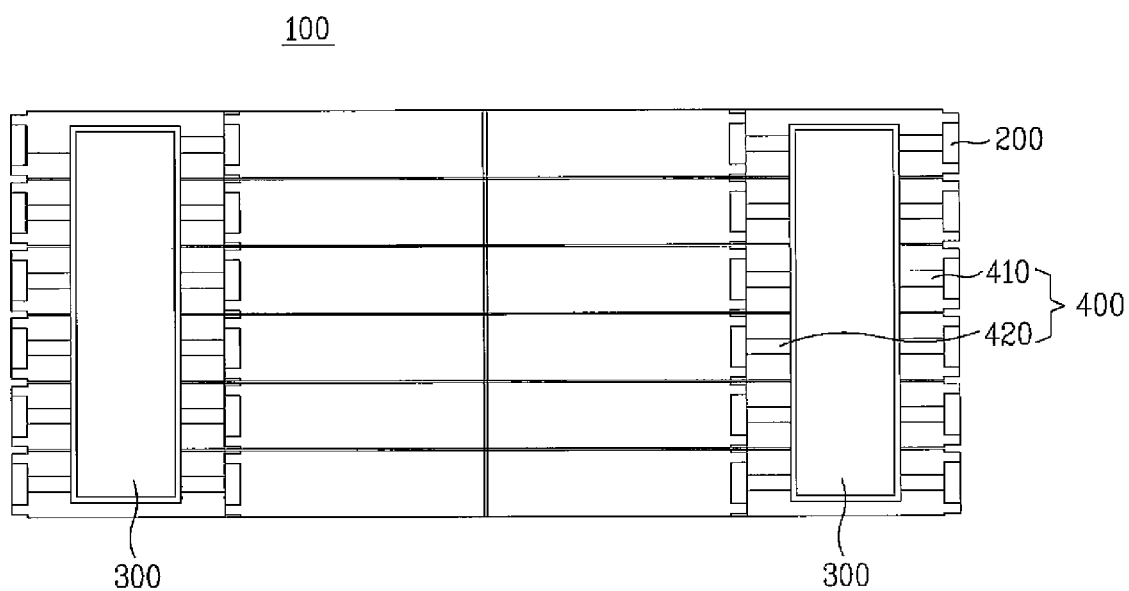
FIG. 11 is a plane view illustrating the back surfaces of the circuit board and drivers according to an embodiment of the present invention.

FIG. 6 illustrates the back surfaces of the circuit boards 100. A driver 300 (FIG. 11) is connected to the back surfaces of the associated circuit boards 100 by connecting lines 400 (FIG. 11). Because each connector 200 has a connecting portion extending in a perpendicular direction to the plane of the circuit board 100, the connectors 200 can be more easily coupled to the connecting lines, and thus to the driver 300.

Figure 8:
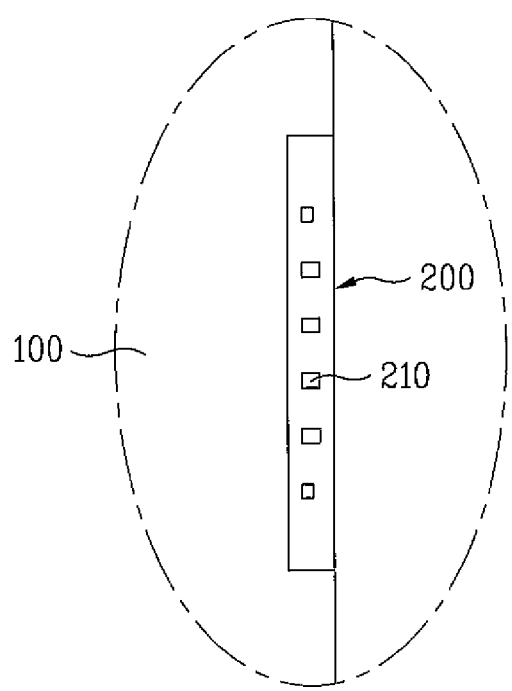
FIG. 8 is an enlarged view corresponding to a portion "B" of FIG. 6.

That is, because the connecting portion of each connector 200 is exposed when viewing the back side of the associated circuit board 100, as shown in FIG. 6, it is possible to directly connect the connecting lines 400 to the connector 200 without changing the connection direction of the connecting lines 400 or without using any separate tool (FIG. 8). Accordingly, the arrangement of the circuit boards 100 is not restricted by the arrangement of the connectors 200 or the connection positions of the connecting lines 400.

Figure 9:
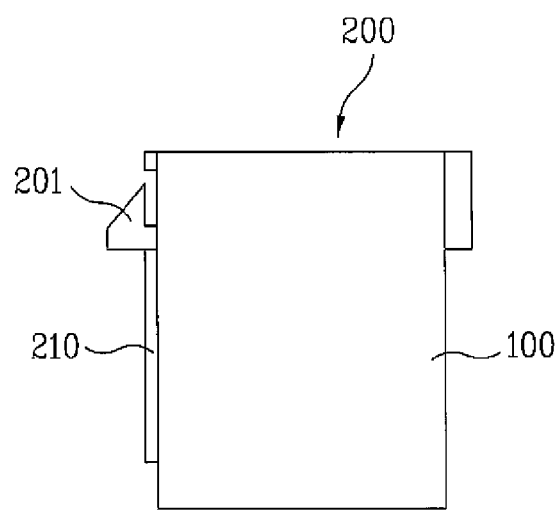
FIG. 9 is a side view illustrating the connectors connected to the circuit boards according to an embodiment of the present invention.
Figure 10:
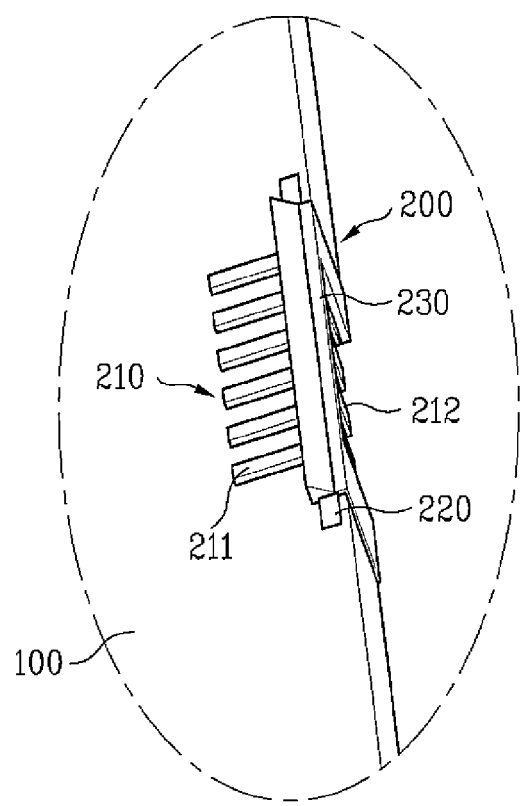
FIG. 10 is a perspective view illustrating the connectors connected to the circuit boards according to an embodiment of the present invention.

FIGS. 7 to 10 illustrate a detailed structure of each connector 200. In more detail, and as shown in FIG. 10, each connector 200 includes a connector body 230, and a plurality of connecting pins 210 provided at the connector body 230. The connector 200 is also coupled to a lead 220 (see FIG. 7).

Figure 7:
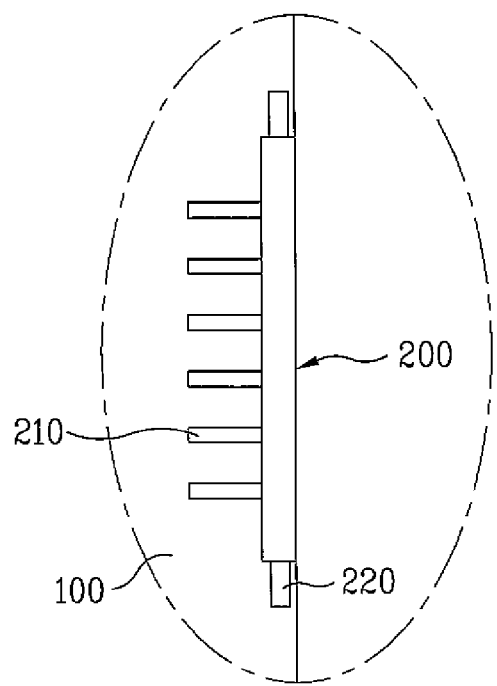
FIG. 7 is an enlarged view corresponding to a portion "A" of FIG. 5.

Further, FIG. 7 is an enlarged view corresponding to a portion "A" of FIG. 5, whereas FIG. 8 is an enlarged view corresponding to a portion "B" of FIG. 6. Further, the connecting pins 210 shown in FIG. 7 are adapted to be in contact with the connecting pads 120 of the circuit board 100. The connecting pins 210 shown in FIG. 8 are adapted to be coupled to the connecting lines 400 connected to the driver 300 as shown in FIG. 11.

As shown in FIG. 10, the connecting pins 210 of the connector 200 include first pins 211 adapted to be connected to the connecting pad 210 of the circuit board 100, and second pins 212 extending toward the back surface of the circuit board 100 while being bent with respect to the first pins 211. Further, it is preferable that the second pins 212 are bent from the first pins by about 90°.

The first pins 211 and second pins 212 may be made of a conductive material, and may be formed such that one first pin 212 and one second pin 212 have an integral and bent structure. The connecting pins 210, which have such a structure, are coupled to the connector body 230 such that they extend in parallel. Further, each connecting pin 210 is bent in a direction perpendicular to the plane of the circuit board 100.

In this structure, each connector 200 can be connected to the driver 300 by connecting the connecting lines 400 (FIG. 11) to the vertically-bent portions of the connecting pins 210, respectively. In addition, because the connecting pins 210 of each connector 200 are bent toward the back surface of the associated circuit board 100, it is possible to connect the connector 200 to the driver 300 while securing the circuit boards 100 of the backlight unit to be densely arranged. Accordingly, it is possible to arrange the circuit boards 100 in various arrangements even when the size of each circuit board 100 is small.

Next, FIG. 9 is a side view illustrating a coupled state of each connector 200 to the associated circuit board 100. As shown the connector 200 includes a fastener 201 adapted to firmly couple the connector 200 to the circuit board 100 or to a case of the backlight unit. As shown in FIG. 11, the connecting lines 400 are connected to the vertically-bent portion of the connector 200 coupled to each circuit board 100. The connecting lines 400 are also connected to the driver 300 adapted to drive the LEDs mounted to the circuit board 100.

In more detail, FIG. 11 illustrates the back surfaces of the circuit boards 100. As shown in FIG. 11, connecting lines 410 and 420 are connected to each driver 300 at opposite sides of the driver 300. Thus, the circuit boards 100 can be connected to each driver 300 at the opposite sides of the driver 300 by the connecting lines 400 so that the circuit boards 100 can be driven by the driver 300.

In FIG. 11, the circuit boards 100 in the left two circuit board columns can be connected to and driven by the left driver 300, whereas the circuit boards 100 in the right two circuit board columns can be connected to and driven by the right driver 300. That is, one-side ones of the circuit boards 100 in two circuit board columns to be connected to the same driver 300 are connected to one side of the driver 300 by the first connecting lines 410, whereas the other-side ones of the circuit boards 100 are connected to the other side of the driver 300 by the second connecting lines 410. In addition, each driver 300 can be configured to have separate structures for respective circuits 100. However, it is preferred the driver 300 have an integrated structure, as shown in FIG. 11.

As described above, LEDs are mounted to the front surfaces of the multiple circuit boards 100 which are arranged in horizontal and vertical directions. Also, the drivers 400 are connected to the circuit boards 100 by the connectors 200 and connecting lines 400. The circuit boards 100 are also arranged in the backlight unit case. Further, diffusion plates or diffusion lenses may be arranged over the circuit boards 100, in order to uniformly diffuse light emitted from the LEDs.

SECOND EMBODIMENT

Figure 12:
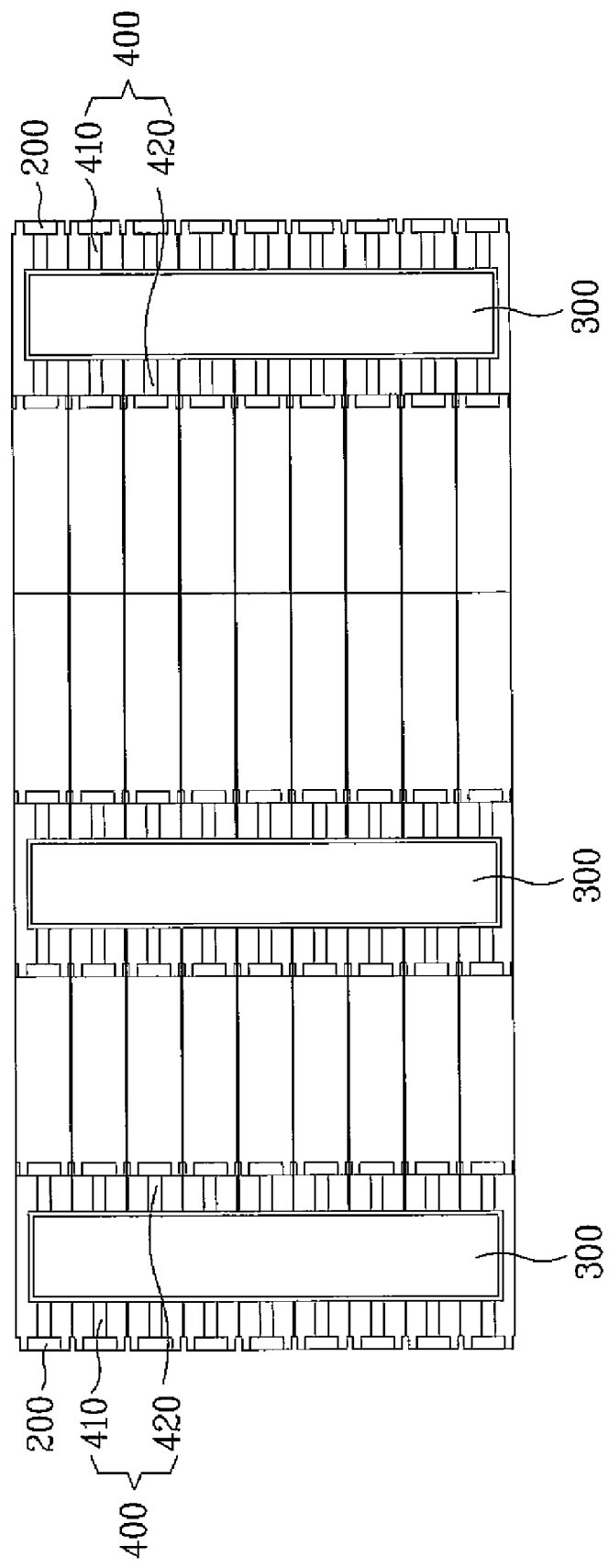
FIG. 12 is a plane view illustrating back surfaces of circuit boards according to an embodiment of the present invention.

The circuit boards 100 can also be arranged in 4 or more columns. For example, FIG. 12 illustrates a 6-column arrangement of circuit boards 100. Further, the connectors 200 are coupled to respective circuit boards 100 such that the connector 200 associated with each circuit board 100 in a first column, a second column, a third column, and a fourth column is arranged at the left side of the associated circuit board 100, and the connector 200 associated with each circuit board 100 in a fifth column and a sixth column is arranged at the right side of the associated circuit board 100. Each connector 200 is connected to the driver 300 by the connecting lines 400. The position of each connector 200 may be changed.

As shown in FIG. 12, one-side of the circuit boards 100 in two circuit board columns to be connected to the same driver 300 is connected to one side of the driver 300 by first connecting lines 410, whereas the other-sides of the circuit boards 100 are connected to the other side of the driver 300 by second connecting lines 410.

The connectors 200 may have the same structure as that of the connectors 200 shown in FIGS. 7 to 10. That is, each connector 200 has a first connecting portion connected to connecting pads 120 of the associated circuit board 100 at one side of the connector 200, and a second connecting portion bent with respect to the first connecting portion by a certain angle such that the connection direction of the connector 200 is changed toward the back side of the circuit board 100. Accordingly, the connector 200 can be connected with the connecting lines 400 at the back side of the circuit board 100.

As described above, in accordance with the present invention, the circuit boards 100 can be arranged in a plurality of columns. FIG. 11 illustrates a plurality of circuit boards 100 are arranged in 4 columns and in 6 rows, and FIG. 12 illustrates a plurality of circuit boards 100 arranged in 6 columns and in 9 rows.

That is, in accordance with an embodiment the present invention, it is possible to sub-divide the circuit boards 100 such that the circuit boards 100 have a reduced size and are arranged in an increased number of columns, 2 rows or more. Also, the circuit boards 100 can be arranged in odd columns, for example, 3 columns or 5 columns.

In addition, when the circuit boards 100 are sub-divided to have a reduced size, it is possible to implement a chip-on-board type structure or a direct molding type structure, because the unit size of the circuit boards 100 in the overall circuit board structure is small.

As apparent from the above description, the backlight unit according to the present invention has several advantages.

Figure 1:
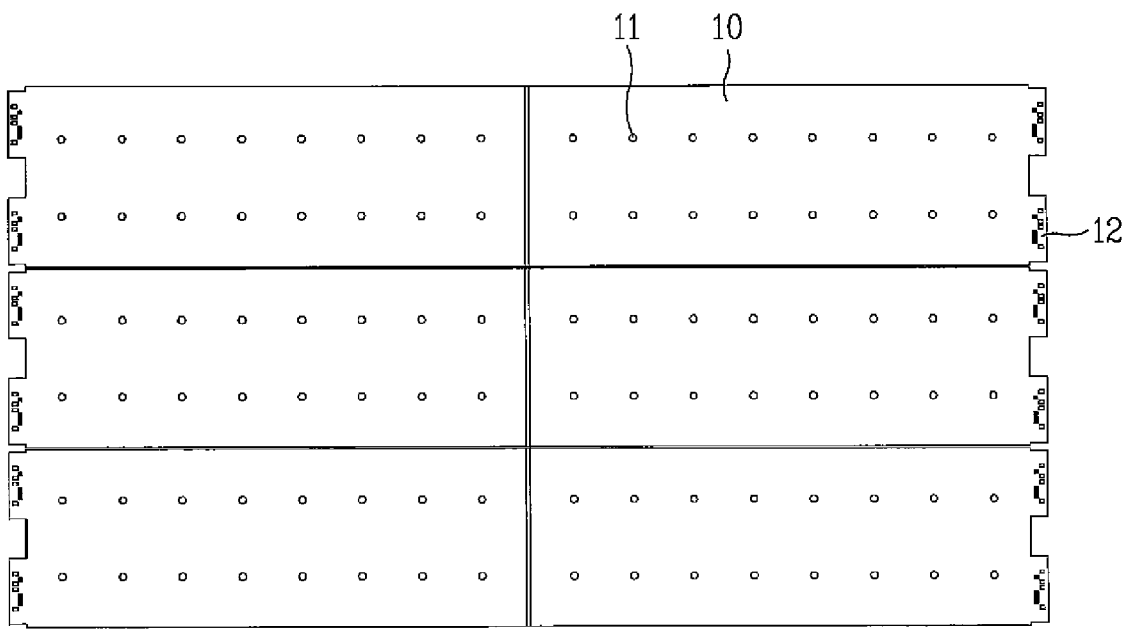
FIG. 1 is a plane view illustrating front surfaces of circuit boards included in a related art backlight unit.
Figure 2:
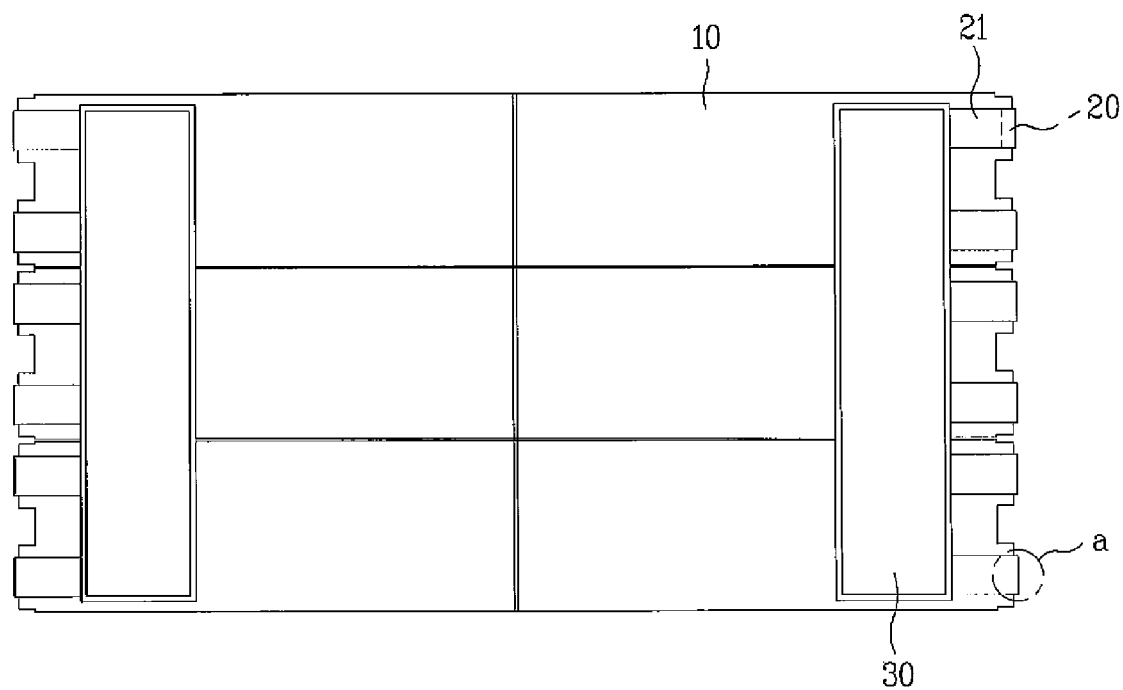
FIG. 2 is a plane view illustrating back surfaces of the circuit boards of the related art backlight unit.
Figure 3:
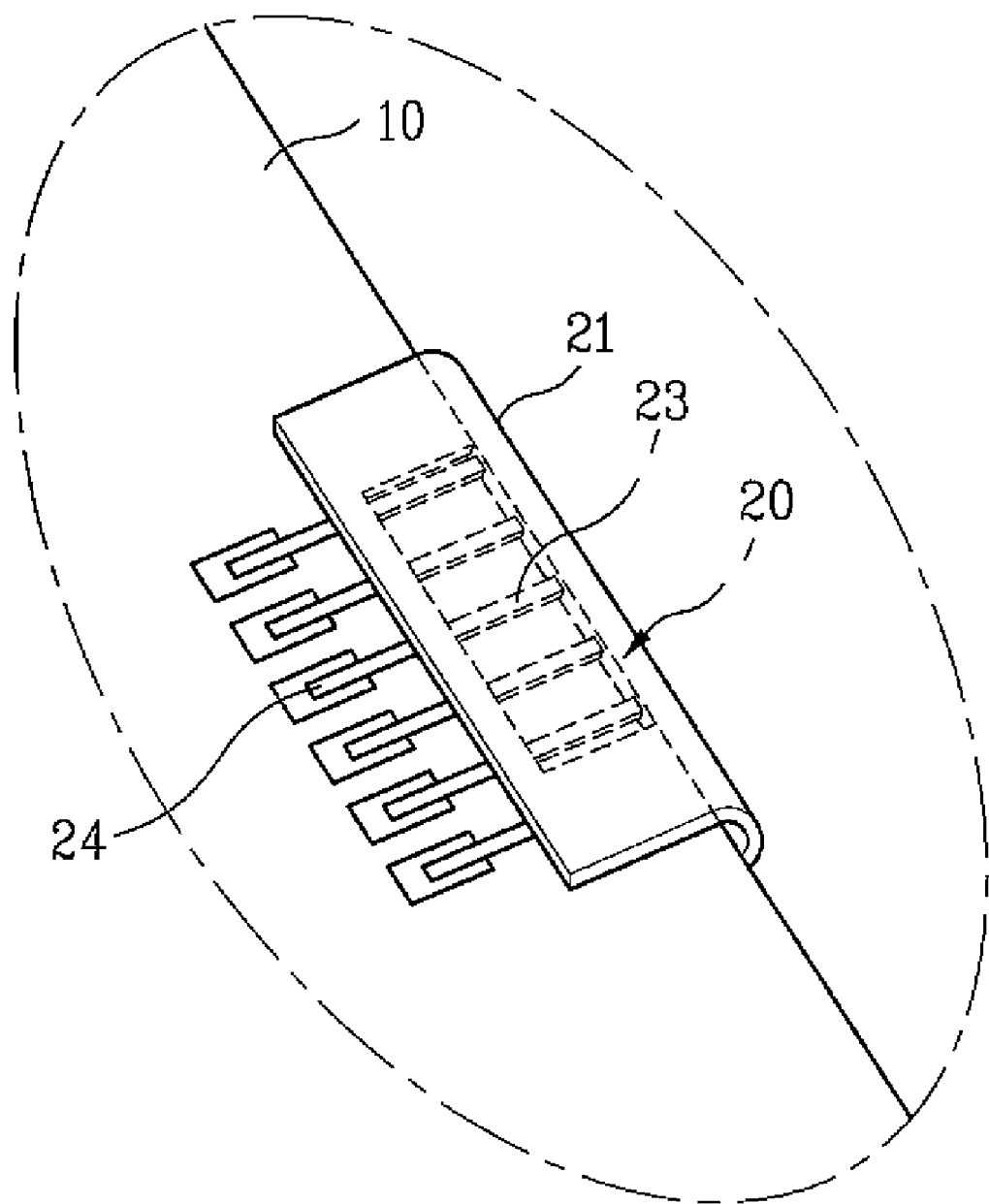
FIG. 3 is an enlarged perspective view corresponding to a portion "a" of FIG. 2.

That is, in the related art backlight unit, only a two-column arrangement is possible, because the connection of each connecting line to each connector must be achieved only in a direction parallel to the plane of the associated circuit board (FIG. 2). In accordance with embodiments of the present invention, however, the circuit boards 100 can be sub-divided such that the circuit boards 100 have a reduced size, and the drivers 300 of the same number as that of the circuit boards 100 can be arranged to drive the sub-divided circuit boards 100, respectively.

Further, when the circuit boards 100 are driven under a sub-divided condition as described above, it is possible to greatly reduce the power consumption during the operation of the backlight unit. This is because it is possible to drive only the circuit boards 100 corresponding to portions of a display screen to be brightly displayed, without driving the circuit boards 100 corresponding to dark portions of the display screen, in spite of image signals received by the latter circuit boards 100, or while supplying only a micro current to the latter circuit boards 100.

In the circuit board structure of the related art backlight unit, it is impossible to reduce the size of each circuit board to a certain size. Thus, all circuit boards are always driven at the same brightness. As a result, the power consumption of the related art backlight unit is very high.

In accordance with embodiments of the present invention, however, there is an advantage because it is possible to effectively reduce the rate of defects of LEDs caused by color deviation or process errors, because the size of each circuit board 100, which is independently driven, is small. Because the size of each circuit board 100 is small, it is possible to manufacture the backlight unit using the existing surface mounting equipment without using separate large-scale surface mounting equipment. Thus, there are many advantages according to the reduced size of the circuit boards 100.

In addition, because the circuit boards 100 can be independently driven in a sub-divided state, it is possible to realize a stereoscopic display screen. Also, this effect results in a reduction in the power consumption of the backlight unit.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight unit, comprising:
   a circuit board mounted with light emitting diodes, and formed with connecting pads electrically connected with the light emitting diodes;
   a driver installed on one surface of the circuit board, and configured to drive the light emitting diodes;
   a connector coupled to the connecting pads of the circuit board, the connector having a connecting direction changed toward the driver; and
   a connecting line for connecting the connector to the driver.

2. The backlight unit according to claim 1, wherein the driver is installed on a first second surface opposite to a surface of the circuit board on which the light emitting diodes are mounted.

3. The backlight unit according to claim 1, wherein the connector comprises an angular connector.

4. The backlight unit according to claim 3, wherein the connector further comprises:
   a plurality of first pins connected to the connecting pads of the circuit board; and
   a plurality of second pins extending from the first pins while being bent from the first pins toward a back side of the circuit board.

5. The backlight unit according to claim 4, wherein the connector further comprises:
   a connector body to which the first pins and the second pins are fixed.

6. The backlight unit according to claim 4, wherein second pins are bent from the first pins by about 90°.

7. The backlight unit according to claim 4, wherein the first pins and the second pins are integrally formed.

8. The backlight unit according to claim 1, wherein the connector is coupled to a lead formed at the circuit board.

9. The backlight unit according to claim 1, wherein the circuit board comprises a plurality of circuit boards arranged in at least two columns.

10. The backlight unit according to claim 9, wherein the connecting line comprises connecting lines connected to the driver at different portions of the driver.

11. The backlight unit according to claim 10, wherein the connecting lines further comprises:
   first connecting lines for connecting a first column of the circuit boards to one side of the driver; and
   second connecting lines for connecting a second column of the circuit boards adjacent to the first column of the circuit boards to the other side of the driver.

12. The backlight unit according to claim 1, wherein the circuit board comprises sub-divided circuit boards respectively driven by a corresponding driver.

13. A backlight unit, comprising:
a circuit board having a first surface on which light emitting diodes are mounted, a second surface on which a driver for driving the light emitting diodes is installed, and connecting pads electrically connected with the light emitting diodes; and
a connector coupled to the connecting pads, the connector having a connecting direction changed toward the second surface of the circuit board.

14. The backlight unit according to claim 13, wherein the connector further comprises:
a plurality of first pins connected to the connecting pads of the circuit board; and
a plurality of second pins extending from the first pins while being bent from the first pins toward the second surface of the circuit board.

15. The backlight unit according to claim 13, wherein the connector further comprises:
a connecting line for connecting the connector to the driver.

16. The backlight unit according to claim 13, wherein the circuit board comprises at least two columns of circuit boards connected to the driver.

17. The backlight unit according to claim 13, wherein the connector includes connecting pins extending toward the second surface.

18. A printed circuit board, comprising:
a connector including a plurality of first pins connected to a circuit of the printed circuit board, and a plurality of second pins extending from the first pins while being bent from the first pins; and
a connecting line connected to the connector, wherein a plurality of light emitting diodes are bonded to the printed circuit board.

19. The printed circuit board according to claim 18, wherein the second pins of the connector are bent from the first pins by about 90°.

20. A lighting device, comprising:
a circuit board having a first surface mounted with light emitting diodes, at least one driver configured to drive the light emitting diodes, and connecting pads electrically connected to the light emitting diodes; and
a connector coupled to the connecting pads of the circuit board, the connector having a connecting direction changed toward the first surface of the circuit board.

21. The lighting device according to claim 20, wherein the connector further comprises:
a plurality of first pins connected to the connecting pads of the circuit board; and
a plurality of second pins extending from the first pins while being bent from the first pins toward the second surface of the circuit board.

22. The lighting device according to claim 20, further comprising:
a connecting line for connecting the connector to the driver.

* * * * *